(12) United States Patent
Rodmar

(10) Patent No.: US 8,232,539 B2
(45) Date of Patent: Jul. 31, 2012

(54) SHUTTER SYSTEM

(75) Inventor: Markus Rodmar, Vallentuna (SE)

(73) Assignee: Sandvik Intellectual Property AB, Sandviken (SE)

( * ) Notice: Subject to any disclaimer, the term of this patent is extended or adjusted under 35 U.S.C. 154(b) by 104 days.

(21) Appl. No.: 12/744,969

(22) PCT Filed: Dec. 8, 2008

(86) PCT No.: PCT/SE2008/051416
§ 371 (c)(1),
(2), (4) Date: Sep. 10, 2010

(87) PCT Pub. No.: WO2009/075635
PCT Pub. Date: Jun. 18, 2009

(65) Prior Publication Data
US 2010/0327193 A1    Dec. 30, 2010

(30) Foreign Application Priority Data

Dec. 12, 2007 (SE) ...................................... 0702772

(51) Int. Cl.
*G21K 1/04* (2006.01)
(52) U.S. Cl. .................................................. 250/515.1
(58) Field of Classification Search ............... 250/515.1, 250/505.1
See application file for complete search history.

(56) References Cited

U.S. PATENT DOCUMENTS

| 5,584,973 A | 12/1996 | Wada et al. |
| 6,315,877 B1 | 11/2001 | Goedicke et al. |
| 6,543,766 B2 * | 4/2003 | Neri et al. ..................... 271/217 |
| 2003/0050159 A1 | 3/2003 | Kato et al. |
| 2005/0199490 A1 | 9/2005 | Nomura et al. |

FOREIGN PATENT DOCUMENTS

| JP | 62-030877 | 2/1987 |
| JP | 4193948 | 7/1992 |
| JP | 2000-178728 | 6/2000 |
| JP | 2003-073823 | 3/2003 |
| JP | 2007-302924 | 11/2007 |

OTHER PUBLICATIONS

Supplementary European Search Report mailed Nov. 3, 2010 issued in EP Application No. 08860313.9.

* cited by examiner

*Primary Examiner* — Kiet T Nguyen
(74) *Attorney, Agent, or Firm* — Morgan, Lewis & Bockius LLP

(57) ABSTRACT

The present invention relates to a shutter system operable between an open position, and a closed position operable to avoid unintended exposure of a surface to radiant flux, wherein said shutter system comprises at least one pair of shields, and an axis for each shield, wherein a first axis is connected to an end part of a first shield, and coincides with the turning axis of the first shield, wherein a second axis, in the shape of an angled arm, is connected to an end part of a second shield and the turning axis of the second shield is parallel to the turning axis of said first shield and is arranged at a distance from the second shield.

17 Claims, 4 Drawing Sheets

– – US 8,232,539 B2

SHUTTER SYSTEM

FIELD OF THE INVENTION

The present invention relates to a shutter system operable between an open position, and a closed position operable to avoid unintended exposure of a surface to radiant flux.

BACKGROUND OF THE INVENTION

Shutters of many kinds are used in the industry today to avoid unintended exposure of a surface to radiant flux, either of material, e.g., during a deposition process, or of electromagnetic radiation, such as, e.g., ultraviolet (UV) or infrared (IR) light. Shutters have in the closed position a shield in front of the area that has to be shielded and the shield is in the open position shifted to a position outside the screening area.

Shutters are sometimes used in Physical Vapor Deposition (PVD) processes when not all deposition sources are being used simultaneously. E.g., the TiAl and Ti sources are used in a sequence during deposition of a TiAlN layer followed by a TiN layer. The Ti source is preferably screened by a shutter during TiAlN deposition to avoid a layer of TiAlN being formed on the Ti source, and during the TiN deposition the shutter in front of the Ti source is open, but another shutter is closed in front of the TiAl source.

Another example is a shutter between the detector of an instrument (e.g., an optical spectrometer) and the studied process, e.g., a light source (UV, visible or IR). The shutter avoids unwanted exposure during the time the detector is not measuring.

The most common designs of shutters are schematically shown in FIGS. 1-2. In FIG. 1 there is schematically shown two different side views of a shutter 100 with one axis 102 and a shutter shield 104 mounted close to or at the periphery of the shield. The shutter 100 opens (position A) and closes (position B) by turning (arrow 106) the axis 102 of the shutter 100. The advantages are a robust design and that no extra space is required in front of the deposition source 108, but it requires a lot of space beside the shutter 100 when the shield 104 is in an open position (position A). This limits the number of other parts beside the shutter 100, as, e.g., in a PVD equipment, where sources 108, heater, and viewports are placed in the wall 110 of the PVD recipient.

In FIG. 2 there is shown two different side views of a shutter 120 with two axis $122_1$, $122_2$ and two shields $124_1$, $124_2$, which are often rectangular as shown in FIG. 2. The shutter 120 opens (position A) and closes (position B) by turning the two axis $122_1$, $122_2$ of the shutter 120. The advantages are a robust design, and the space beside the shutter 120 is in the open position (position A) only occupied by the area of the shields $124_1$, $124_2$, in contrast to the shutter shown in FIG. 1. It is therefore possible to screen a big rectangular area with less extra space required. In FIG. 2 there is also shown the deposition source 126. The disadvantages are the space that is required in front of the shutter 120 when turning from the closed (position B) to the open position (position A) and the space required in the open position (position A), even though it is less than for the shutter shown in FIG. 1. The space that is required in front of the shutter 120 is critical in some processes, e.g., some PVD processes. This space sets the shorter limit of the distance between the source 126 and the substrate in the PVD equipment, and the deposition rate decreases with increasing distance between the source 126 and the substrate. As is apparent in FIG. 2, where the screening width is denoted w, the open width for each shield 12 is $o=w/2$ and the critical distance in front of the shutter 120 is $a=w/2$.

A similar shutter consists of only one side of the shutter 120 shown in FIG. 2, i.e., only one axis, and one shield, but that increases the space required in front of the shutter.

U.S. Pat. No. 6,315,877 describes a PVD equipment. The equipment includes a shutter which moves along the sides of the wall, i.e., perpendicular to the radial and vertical direction of the vacuum chamber. This solution requires no extra space in front of the shutters, only the space of the shields beside the screening area in the open position. It is therefore suitable for screening large rectangular areas. However, the occupied area in the open position is still the same as for the shutter shown in FIG. 1. The equipment to control the shutters in U.S. Pat. No. 6,315,877 is also rather complex and the system is therefore not as robust as the shutters shown in FIG. 1 and/or FIG. 2.

SUMMARY OF THE INVENTION

The above mentioned problems are solved by a shutter system according to Claim 1. The shutter system is operable between an open position, and a closed position operable to avoid unintended exposure of a surface to radiant flux. The shutter system comprises at least one pair of shields, and an axis for each shield. A first axis is connected to an end part of a first shield, and coincides with the turning axis of the first shield. A second axis, in the shape of an angled arm, is connected to an end part of a second shield, and the turning axis of the second shield is parallel to the turning axis of said first shield and is arranged at a distance from the second shield.

A main advantage with the shutter system according to the present invention is that the occupied area in the open position is reduced in comparison to the above described known shutters.

Furthermore, the shutter system according to the present invention has a rather moderate critical space in front of the shutter. This critical space is reduced compared to, e.g., the shutter shown in FIG. 2.

A further advantage is achieved if $x>=y$, where x denotes the perpendicular distance between the turning axis of said second shield and an edge of said second shield closest to said first shield when said shutter system is in the closed position, and where y denotes the perpendicular distance between the turning axis of said second shield and the connecting point where said first axis is connected to said end part of said first shield.

Furthermore, it is an advantage if, when said shutter system is in the closed position, said first shield and said second shield are partly overlapping each other, and are not in alignment with each other.

According to another embodiment, it is an advantage if, when said shutter system is in the closed position, said first shield and said second shield are partly overlapping each other, and are bent in the overlapping are, and are in alignment with each other except in said overlapping area.

A further advantage is achieved if, when said shutter system is in the open position, said first shield and said second shield are placed onto each other.

Furthermore, it is an advantage if said second axis is connected to the middle of a short side of said second shield, and the turning axis of said second shield is positioned approximately above the center of a short side of said first shield when said shutter system is in the closed position.

A further advantage is achieved if, when said first and second axis have been turned 90° in relation to the positions of said first and second axis when said shutter system is in the closed position, said first shield and said second shield are parallel to each other.

Furthermore, it is an advantage if said shutter system also comprises a third axis and a fourth axis wherein said third and fourth axis are connected to said first and second shields in the same way as said first and second axis, but mirror symmetrical in relation to a center axis of said first and second shields, which center axis is perpendicular to the turning axis of said first to fourth axis.

A further advantage is achieved, if said shutter system also comprises support stands arranged at said first and second shields in connection with said third and fourth axis.

Furthermore, it is an advantage if said shutter system also comprises a second pair of shields and an axis for each shield, wherein said second pair of shields and said axis are arranged in the same way as said first pair of shields and said first and second axis, but arranged in such a way that said axis are mirror symmetrical to said first and second axis in relation to a center axis parallel to the turning axis of said axis and arranged in the middle of said shutter system.

A further advantage is achieved if, when said shutter system is to be opened, said axis and said first pair of shields are turned clockwise, and said second pair of shields are turned counter-clockwise.

Furthermore, it is an advantage if, when said shutter system is in the closed position, said second shield and said shield are partly overlapping each other, and are not in alignment with each other.

According to another embodiment, it is an advantage if, when said shutter system is in the closed position, said first shield and said second shield are partly overlapping each other, and are bent in the overlapping area, and are in alignment with each other except in said overlapping area.

It will be noted that the term "comprises/comprising" as used in this application is intended to denote the presence of a given characteristic, step or component, without excluding the presence of one or more other characteristic features, integers, steps, components or groups thereof.

Embodiments of the invention will now be described with a reference to the accompanying drawings, in which:

BRIEF DESCRIPTION OF THE PREFERRED EMBODIMENTS

DETAILED DESCRIPTION OF THE PREFERRED EMBODIMENTS

Figure 3:
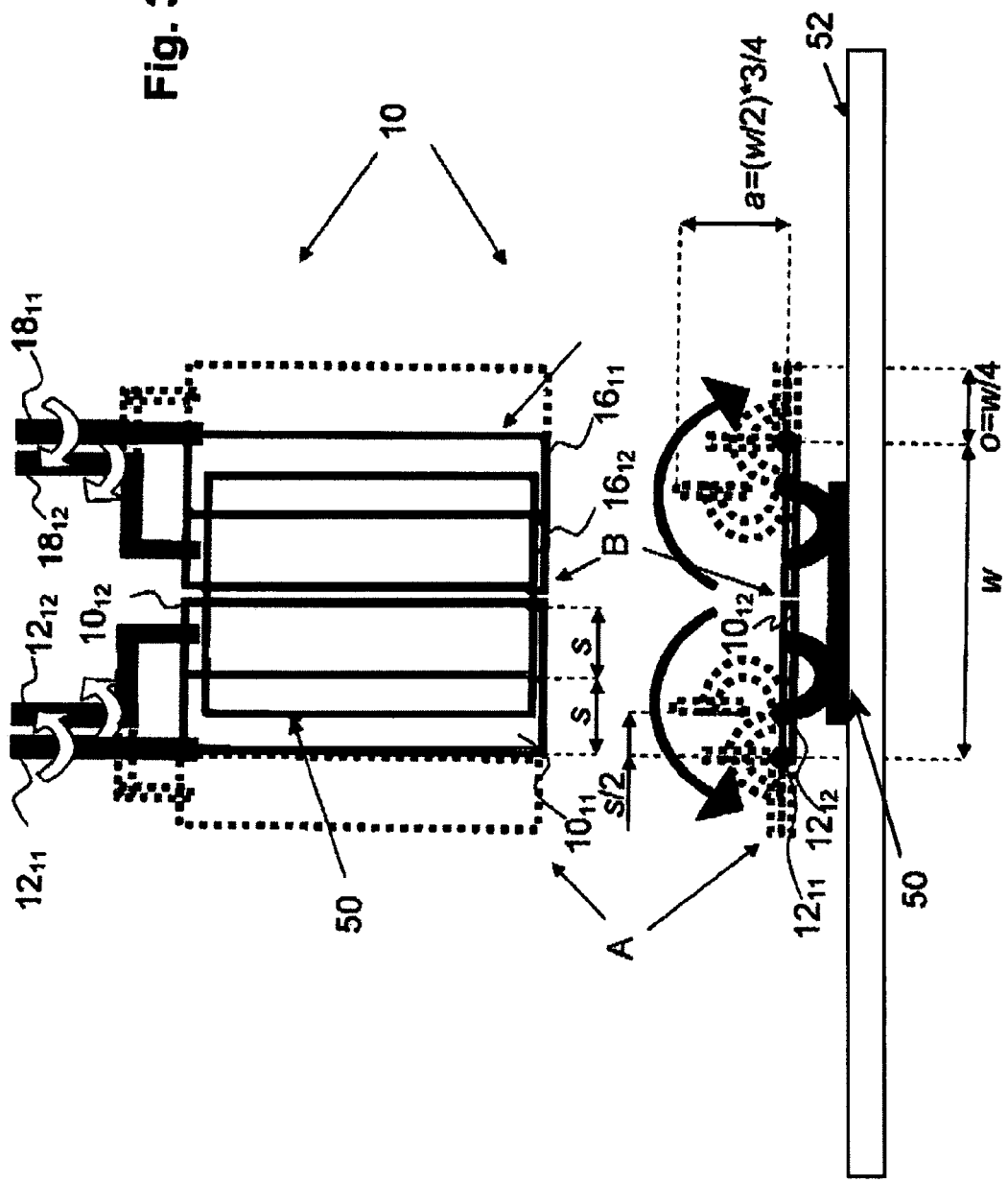
FIG. 3 shows schematically two different side views of a shutter system 10 according to the invention.

In FIG. 3 there are schematically shown two different side views of a shutter system 10 according to the present invention. The shutter system 10 is operable between an open position A, and a closed position B operable to avoid unintended exposure of a surface to radiant flux. The shutter system 10, in the embodiment shown in FIG. 3, comprises a first pair of shields $10_{11}$, $10_{12}$ and an axis $12_{11}$, $12_{12}$ for each shield $10_{11}$, $10_{12}$. The first axis $12_{11}$ is connected to an end part of a first shield $10_{11}$ of said first pair, and coincides with the turning axis (illustrated with the arrow $C_{11}$ in FIG. 3) of the first shield $10_{11}$. The second axis $12_{12}$, in the shape of an angled arm, is connected to an end part of a second shield $10_{12}$ of said first pair, and the turning axis (illustrated with the arrow $C_{12}$ in FIG. 3) of the second shield $10_{12}$ is parallel to the turning axis $C_{11}$ of the first shield $10_{11}$ and is arranged at a distance from the second shield $10_{12}$. The turning axis $C_{12}$ is suitably positioned above the first shield $10_{11}$ when the shutter system 10 is in the closed position. In the embodiment shown in FIG. 3, the shutter system 10 also comprises a second pair of shields $16_{11}$, $16_{12}$, and an axis $18_{11}$, $18_{12}$ for each shield $16_{11}$, $16_{12}$. The second pair of shields $16_{11}$, $16_{12}$, and the axis $18_{11}$, $18_{12}$ are arranged in the same way as the first pair of shields $10_{11}$, $10_{12}$ and the first and second axis $12_{11}$, $12_{12}$, but arranged in such a way that the axis $18_{11}$, $18_{12}$ are mirror symmetrical to the first and second axis $12_{11}$, $12_{12}$ in relation to a center axis parallel to the turning axis of the axis $12_{11}$, $12_{12}$, $18_{11}$, $18_{12}$, and arranged in the middle of the shutter system 10.

As is apparent in FIG. 3, the first shield $10_{11}$ and the second shield $10_{12}$ are placed onto each other when said shutter system 10 is in the open position, A, shown with dashed lines. As also shown in FIG. 3, the same applies for the second pair of shields $16_{11}$, $16_{12}$, i.e., they are also placed onto each other when the shutter system is in the open position A.

As is also apparent in the lower part of FIG. 3 and is shown with dashed lines, when the first and second axis $12_{11}$, $12_{12}$ have been turned 90° in relation to their position when the shutter system 10 is in the closed position, B, the first shield $10_{11}$ and the second shield $10_{12}$ are parallel to each other, indicated with the reference signs $10'_{11}$, $10'_{12}$. The same applies for the second pair of shields $16_{11}$, $16_{12}$, indicated with the reference signs $16'_{11}$, $16'_{12}$.

In accordance with one embodiment of the shutter system 10, which is shown in FIG. 3, the second axis $12_{12}$ is connected to the middle of a short side of the second shield $10_{12}$. The turning axis (illustrated with the arrow $C_{12}$) of the second shield $10_{12}$ is positioned approximately above the center of a short side of the first shield $10_{11}$ when the shutter system 10 is in the closed position, B. The same applies in principle for the axis $18_{12}$, i.e., the axis $18_{12}$ is connected to the middle of a short side of the shield $16_{12}$. The turning axis (illustrated with the arrow $D_{12}$ in FIG. 3) of the shield $16_{12}$ is positioned approximately above the center of a short side of the shield $16_{11}$ when the shutter system 10 is in the closed position, B. The axis $18_{11}$ is connected to an end part of the shield $16_{11}$, and coincides with the turning axis (illustrated with the arrow $D_{11}$ in FIG. 3) of the shield $16_{11}$.

According to one embodiment of the shutter system 10 according to the present invention, the first shield $10_{11}$ and the second shield $10_{12}$ are partly overlapping each other, and are not in alignment with each other when the shutter system 10 is in the closed position. The same applies to the shields $16_{11}$, $16_{12}$.

According to another embodiment of the shutter system 10 according to the present invention, the first shield $10_{11}$ and the second shield $10_{12}$ are partly overlapping each other, are bent in the overlapping area, and are in alignment with each other except in the overlapping area when the shutter system 10 is in the closed position. Also in this embodiment, the same applies to the shields $16_{11}$, $16_{12}$.

As is apparent in FIG. 3, the first shield $10_{11}$ and the second shield $10_{12}$ are placed onto each other when the shutter system is in the open position, indicated with the dashed lines. The same also applies to the shields $16_{11}$, $16_{12}$, also indicated with the dashed lines.

As is apparent in FIG. 3, when the shutter system 10 is to be opened, the axis $12_{11}$, $12_{12}$ and the first pair of shields $10_{11}$, $10_{12}$ are turned counter clockwise, and the axis $18_{11}$, $18_{12}$ and the second pair of shields $16_{11}$, $16_{12}$ are turned clockwise.

Furthermore, according to one embodiment of the shutter system 10 according to the present invention, when the shutter system 10 is in the closed position, B, the second shield $10_{12}$ and the second shield $16_{12}$ are partly overlapping each other, and are not in alignment with each other.

According to another embodiment of the shutter system 10 according to the present invention the second shield $10_{12}$ and the shield $16_{12}$ are partly overlapping each other, and are bent in the overlapping area, and are in alignment with each other except in the overlapping area when the shutter system 10 is in the closed position, B.

According to another embodiment of the shutter system 10 according to the present invention, it also comprises a third axis $14_{11}$ and a fourth axis $14_{12}$, which are connected to the first and second shields $10_{11}$, $10_{12}$ in the same way as the first and second axis $12_{11}$, $12_{12}$ but mirror symmetrical in relation to a center axis of the first and second shields $10_{11}$, $10_{12}$, which center axis is perpendicular to the turning axis of the first to fourth axis $12_{11}$, $12_{12}$, $14_{11}$, $14_{12}$. Furthermore, the shutter system 10 can also comprise support stands arranged at the first and second shields $10_{11}$, $10_{12}$ in connection with the third and the fourth axis $14_{11}$, $14_{12}$. Also the second pair of shields $16_{11}$, $16_{12}$ can be provided with the further axis and support stands arranged in the same way as the third and fourth axis $14_{11}$, $14_{12}$ and the support stands arranged on the first and the second shields $10_{11}$, $10_{12}$. In other words, the shutter system 10 can be made even more robust by attaching axis and support stands at the other short side of the shields.

As also is apparent in FIG. 3, when the shutter system 10 is in the closed position, B, the four shields $10_{11}$, $10_{12}$, $16_{11}$, $16_{12}$ are placed in front of the deposition source 50, which in this situation is placed between on the one hand the four shields $10_{11}$, $10_{12}$, $16_{11}$, $16_{12}$ and on the other hand the recipient wall 52.

As is also apparent in FIG. 3, there is also shown some different distances important for explaining some advantages with the shutter system 10 according to the present invention; at least the embodiment shown in FIG. 3. The screening width, i.e., the width that the four shields $10_{11}$, $10_{12}$, $16_{11}$, $16_{12}$ cover when the shutter system 10 is in the closed position, B, is denoted w. The opened width, i.e., the width at each side of the deposition source 50 when the shutter system 10 is in the opened position, A, is denoted o and is equal to w/4 as is apparent in FIG. 3. Also shown in FIG. 3, the critical distance, i.e., the largest distance needed in front of the shutter system 10 when opening or closing the shields $10_{11}$, $10_{12}$, $16_{11}$, $16_{12}$ is denoted a and is equal to w/2*¾.

Figure 1:
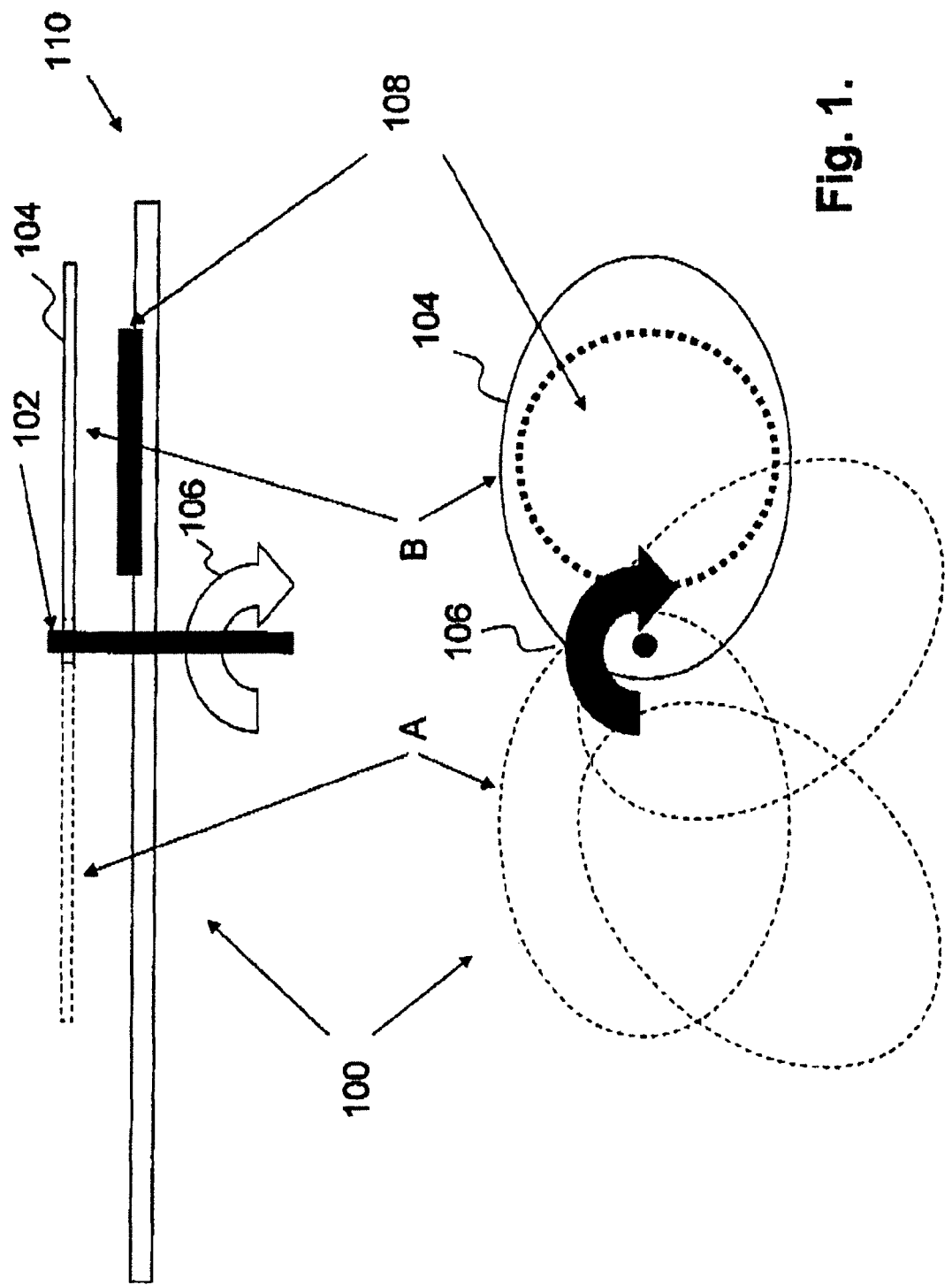
FIG. 1 shows schematically two different side views of a prior art shutter.
Figure 2:
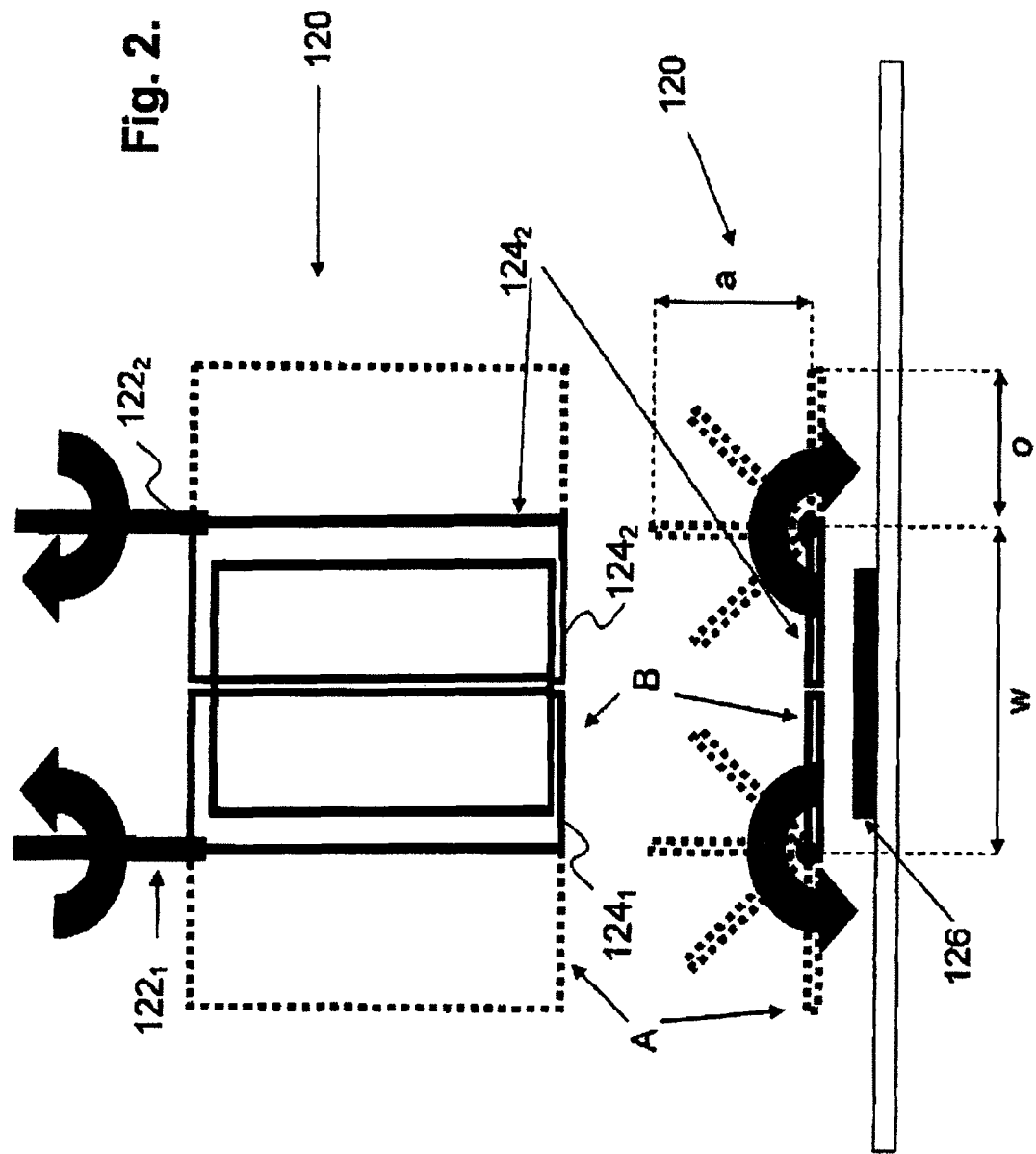
FIG. 2 shows schematically two different side views of another prior art shutter.

This means that the critical distance, a, is a factor ¾ compared to the shutter in FIG. 2. Furthermore, the occupied area in the open position is reduced by half, compared to the shutters in FIG. 1 and FIG. 2.

It is pointed out that these distances are correct when the width of each shield is s, and the perpendicular distance between the turning axis of the second shield $10_{12}$ and the connecting point where the first axis $12_{11}$ is connected to the end part of the shield $10_{11}$ is s/2.

Figure 4:
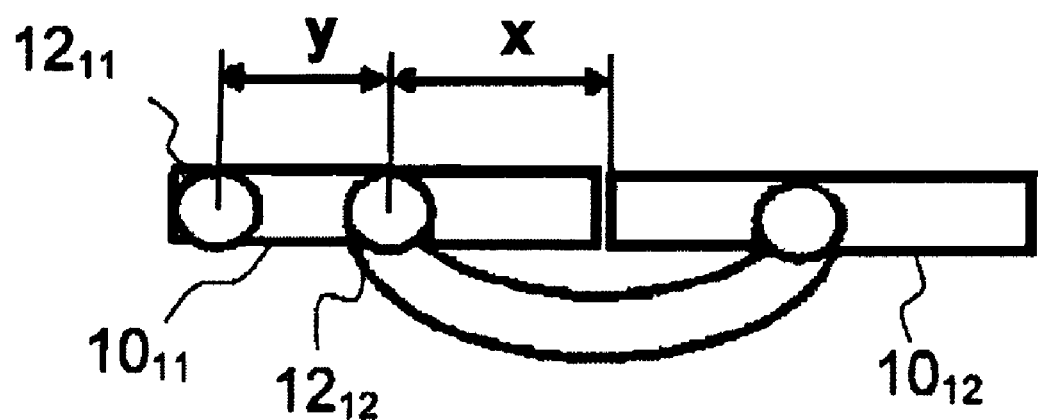
FIG. 4 shows schematically the distances x and y in the shutter system 10 according to the invention.

A more general case is shown in FIG. 4. There is shown the first shield $10_{11}$, the second shield $10_{12}$, the first axis $12_{11}$ and the second axis $12_{12}$, e.g., from a top view. x denotes the perpendicular distance between the turning axis of the second shield $10_{12}$ and an edge of the second shield $10_{12}$ closest to the first shield $10_{11}$ when the shutter system 10 is in the closed position. y denotes the perpendicular distance between the turning axis of the second shield $10_{12}$ and the connecting point where the first axis $12_{11}$ is connected to the end part of the first shield $10_{11}$. In this general case x>=y.

It is also pointed out that another embodiment of the shutter system 10 according to the present invention, although not shown in any figure, only comprises two shields, e.g., $10_{11}$, $10_{12}$, i.e., only half of the shutter system 10 shown in FIG. 3.

The invention is not limited to the embodiments described in the forgoing. It will be obvious that many different modifications are possible within the scope of the following claims.

The invention claimed is:

1. A shutter system operable between an open position, and a closed position operable to avoid unintended exposure of a surface to radiant flux, wherein said shutter system comprises at least one pair of shields, and an axis for each shield, wherein a first axis is connected to an end part of a first shield, and coincides with a turning axis of the first shield, wherein a second axis, in the shape of an angled arm, is connected to an end part of a second shield and a turning axis of said second shield is parallel to the turning axis of said first shield and is arranged at a distance from the second shield.

2. A shutter system according to claim 1, wherein x>=y, where x denotes the perpendicular distance between the turning axis of said second shield and an edge of said second shield closest to said first shield when said shutter system is in the closed position, and where y denotes the perpendicular distance between the turning axis of said second shield and the connecting point where said first axis is connected to said end part of said first shield.

3. A shutter system according to claim 2, wherein, when said shutter system is in the closed position, said first shield and said second shield are partly overlapping each other, and are not in alignment with each other.

4. A shutter system according to claim 2, wherein, when said shutter system is in the closed position, said first shield and said second shield are partly overlapping each other, and are bent in the overlapping area, and are in alignment with each other except in said overlapping area.

5. A shutter system according to claim 1, wherein, when said shutter system is in the closed position, said first shield and said second shield are partly overlapping each other, and are not in alignment with each other.

6. A shutter system according to claim 1, wherein, when said shutter system is in the closed position, said first shield and said second shield are partly overlapping each other, and are bent in the overlapping area, and are in alignment with each other except in said overlapping area.

7. A shutter system according to claim 1, wherein, when said shutter system is in the open position, said first shield and said second shield are placed onto each other.

8. A shutter system according to claim 1, wherein said second axis is connected to the middle of a short side of said second shield, and the turning axis of said second shield is positioned approximately above the center of a short side of said first shield when said shutter system is in the closed position.

9. A shutter system according to claim 1, wherein, when said first and second axes have been turned 90° in relation to the positions of said first and second axes when said shutter system is in the closed position, said first shield and said second shield are parallel to each other.

10. A shutter system according to claim 1, wherein said shutter system also comprises a third axis and a fourth axis, wherein said third and fourth axes are connected to said first and second shields in the same way as said first and second axes but mirror symmetrical in relation to a center axis of said first and second shields, which center axis is perpendicular to the turning axes of said first to fourth axis.

11. A shutter system according to claim 10, wherein said shutter system also comprises support stands arranged at said first and second shields in connection with said third and fourth axes.

12. A shutter system according to claim 1, wherein said shutter system also comprises a second pair of shields, and an axis for each shield, wherein said second pair of shields and said axes are arranged in the same way as said first pair of shields and said first and second axes, but arranged in such a way that said axes are mirror symmetrical to said first and second axes in relation to a center axis parallel to the turning axes of said axes and arranged in the middle of said shutter system.

13. A shutter system according to claim 12, wherein, when said shutter system is to be opened, said axes and said first pair of shields are turned counter clockwise, and said axes and said second pair of shields *are* turned clockwise.

14. A shutter system according to claim 13, wherein, when said shutter system is in the closed position, said second shield and one of said second pair of shields are partly overlapping each other, and are not in alignment with each other.

15. A shutter system according to claim 13, wherein, when said shutter system is in the closed position, said second shield and one of said second pair of shields are partly overlapping each other, and are bent in the overlapping area, and are in alignment with each other except in said overlapping area.

16. A shutter system according to claim 12, wherein, when said shutter system is in the closed position, said second shield and one of said second pair of shields are partly overlapping each other, and are not in alignment with each other.

17. A shutter system according to claim 12, wherein, when said shutter system is in the closed position, said second shield and one of said second pair of shields shield are partly overlapping each other, and are bent in the overlapping area, and are in alignment with each other except in said overlapping area.

* * * * *